(12) United States Patent
Xiao (10) Patent No.: US 9,607,902 B2
(45) Date of Patent: Mar. 28, 2017

(54) SEMICONDUCTOR STRUCTURES AND FABRICATION METHODS THEREOF

(71) Applicant: Semiconductor Manufacturing International (Shanghai) Corporation, Shanghai (CN)

(72) Inventor: Deyuan Xiao, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/813,435

(22) Filed: Jul. 30, 2015

(65) Prior Publication Data
US 2016/0064289 A1 Mar. 3, 2016

(30) Foreign Application Priority Data
Sep. 1, 2014 (CN) .......................... 2014 1 0441272

(51) Int. Cl.
H01L 21/00 (2006.01)
H01L 21/8238 (2006.01)
H01L 27/092 (2006.01)
H01L 21/8258 (2006.01)

(52) U.S. Cl.
CPC .. H01L 21/823821 (2013.01); H01L 21/8258 (2013.01); H01L 27/0924 (2013.01); *H01L 21/823807* (2013.01)

(58) Field of Classification Search
None
See application file for complete search history.

(56) References Cited

U.S. PATENT DOCUMENTS

| | | | |
|---|---|---|---|
| 6,580,137 B2* | 6/2003 | Parke | H01L 29/78648 257/401 |
| 8,796,762 B2* | 8/2014 | Lindsay | H01L 21/26586 257/330 |
| 9,362,181 B1* | 6/2016 | Xie | H01L 21/823878 |
| 2006/0141706 A1* | 6/2006 | Hong | H01L 27/11521 438/257 |
| 2008/0012067 A1* | 1/2008 | Wu | H01L 27/10876 257/330 |
| 2011/0097881 A1* | 4/2011 | Vandervorst | H01L 29/66795 438/486 |

(Continued)

*Primary Examiner* — Evren Seven
(74) *Attorney, Agent, or Firm* — Anova Law Group, PLLC (57) ABSTRACT

A method for forming a semiconductor structure includes sequentially providing a semiconductor substrate having NFET regions and NFET regions; forming an insulation layer on the semiconductor substrate; forming a sacrificial layer on the insulation layer; forming first trenches in the PFET regions, and second trenches in the NFET regions; forming a third trench on the bottom of each of the first trenches and the second trenches; forming a first buffer layer in each of the first trenches and the second trenches by filling the third trenches; forming a first semiconductor layer on each of the first buffer layers in the first trenches and the second teaches; removing the first semiconductor layers in the second trenches; forming a second buffer layer with a top surface lower than the insolation layer in each of second trenches; and forming a second semiconductor layer on each of the second buffer layers.

11 Claims, 7 Drawing Sheets

(56) References Cited

U.S. PATENT DOCUMENTS

| | | | |
|---|---|---|---|
| 2013/0043535 A1* | 2/2013 | Anderson | H01L 21/84 257/347 |
| 2013/0099282 A1* | 4/2013 | Chen | H01L 29/66795 257/190 |
| 2016/0071952 A1* | 3/2016 | Yin | H01L 29/66492 438/283 |

* cited by examiner

SEMICONDUCTOR STRUCTURES AND FABRICATION METHODS THEREOF

CROSS-REFERENCES TO RELATED APPLICATIONS

This application claims the priority of Chinese patent application No. 201410441272.5 filed on Sep. 1, 2014, the entirety of which is incorporated herein by reference.

FIELD OF THE INVENTION

The present invention generally relates to the field of semiconductor manufacturing technology and, more particularly, relates to semiconductor structures and fabrication processes thereof.

BACKGROUND

With the continuous development of semiconductor technology, the size of semiconductor devices has become smaller and smaller. Thus, more defects may occur in CMOS transistors formed on a bulk silicon semiconductor substrate. Further, certain related effects, such as short channel effects, channel punch through effects, or reduction of gate control ability effects, etc., may become more severe using the bulk silicon semiconductor substrate. In order to improve the performance of the semiconductor devices formed on the bulk silicon semiconductor substrate, various device structures have been developed. Such device structures include fully depleted silicon on insulator (FDSOI) devices, fin-field effect transistors (FinFETs), omega gate devices, or gate-all-around nanowire devices, etc.

As multiple gate devices, FinFETs have relatively high gate control abilities. Further, the doping concentration of the channel regions of existing FinFETs is usually relatively low. The low doping concentration may aid to obtain relatively stable threshold voltages. However, comparing with the bulk silicon CMOS transistors, the fabrication process of FinFETs may be more complex; and the production cost may be much higher.

Further, in order to improve the performance of the FinFETs, different materials are often used as the fin materials according to the types of carriers of the FinFETs. However, comparing with the silicon substrate, the production cost of FinFETs formed by using semiconductor materials other than silicon may be relatively high.

Therefore, new device structures and methods may need to be developed to improve the performance of the FinFETs without increasing the production cost. The disclosed device structures and methods are directed to solve one or more problems set forth above and other problems.

BRIEF SUMMARY OF THE DISCLOSURE

One aspect of the present disclosure includes a method for fabricating a semiconductor structure. The method includes providing a semiconductor substrate having a plurality of NFET regions and a plurality of NFET regions; and forming an insulation layer on a surface of the semiconductor substrate. The method also includes forming a sacrificial layer on the insulation layer; and forming a first trench in each of the PFET regions, and a second trench in each of the NFET regions. Further, the method includes forming a third trench under each of the first trenches and the second trenches; and forming a first buffer layer in portions of each of the first trenches and the second trenches, and to fill the third trenches. Further, the method also includes forming a first semiconductor layer on each of the first buffer layers in the first trenches and the second teaches; and removing the first semiconductor layers in the second trenches in the NFET regions. Further, the method also includes forming a second buffer layer with a top surface lower than the insolation layer in each of second trenches and forming a second semiconductor layer on each of the second buffer layers.

Another aspect of the present disclosure includes a semiconductor structure. The semiconductor structure includes a semiconductor substrate having a plurality of PFET regions and a plurality of NFET regions; and an insulation layer formed on a surface of the semiconductor substrate. The semiconductor structure also includes a first buffer layer formed in the semiconductor substrate in each of the plurality of PFET regions and the plurality of NFET regions; and a first semiconductor layer formed on each of the first buffer layers with one portion in the insulation layer and the other portion above the insulation layer in the PFET regions. Further, the semiconductor structure includes a second buffer layer with a surface lower than a surface of the insulation layer formed on each of remaining first semiconductor layers in the NFET regions; and a second semiconductor layer formed on each of the second buffer layers with one portion in the insulation layer and the other portion above the insulation layer in the NFET regions. Further, the semiconductor structure also includes a first gate structure overlying on each of the first semiconductor layers, and a second gate structure overlying on each of the second semiconductor layers.

Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 10:
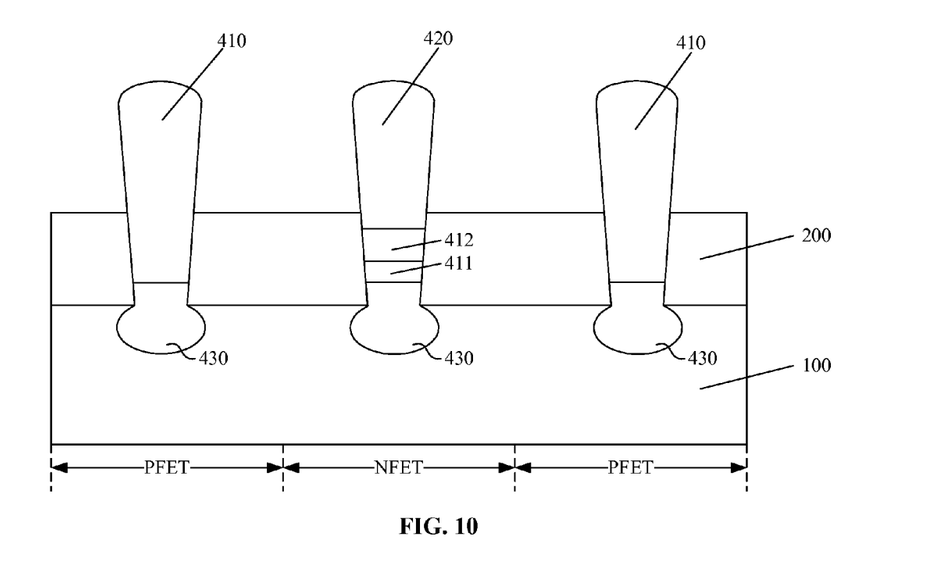
Figure 11:
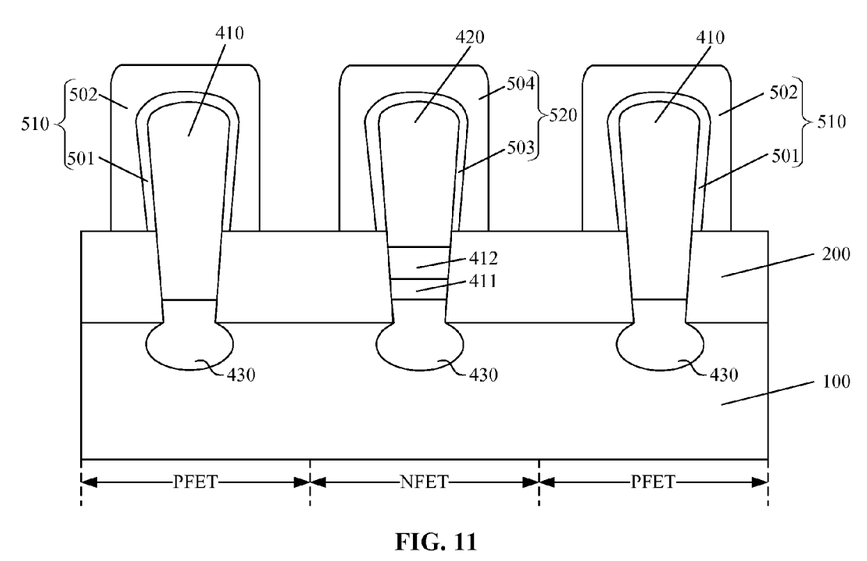
Figure 12:
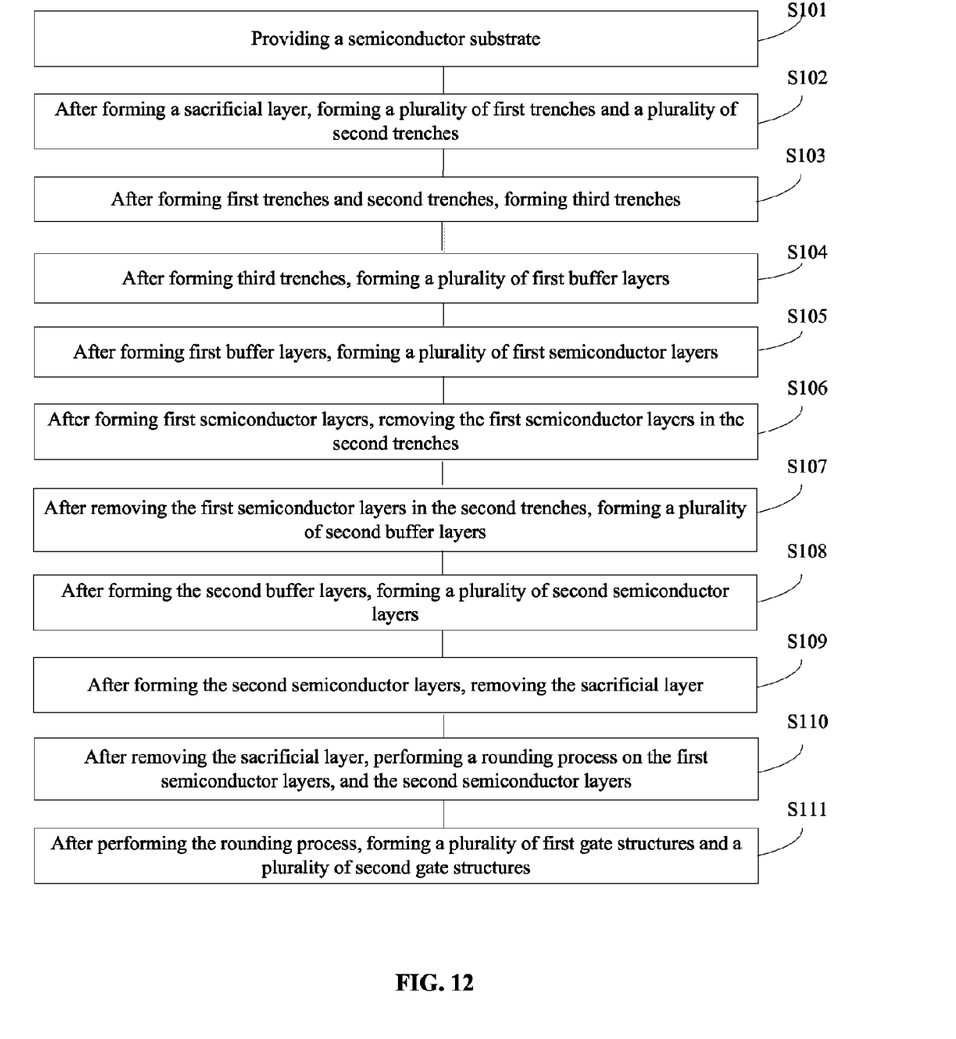
FIG. 12 illustrates an exemplary fabrication process of a semiconductor structure consistent with the disclosed embodiments.

FIG. 12 illustrates an exemplary fabrication process of a semiconductor structure consistent with the disclosed embodiments; and FIG. 1~11 illustrate semiconductor structures corresponding to certain stages of the exemplary fabrication process.

Figure 1:
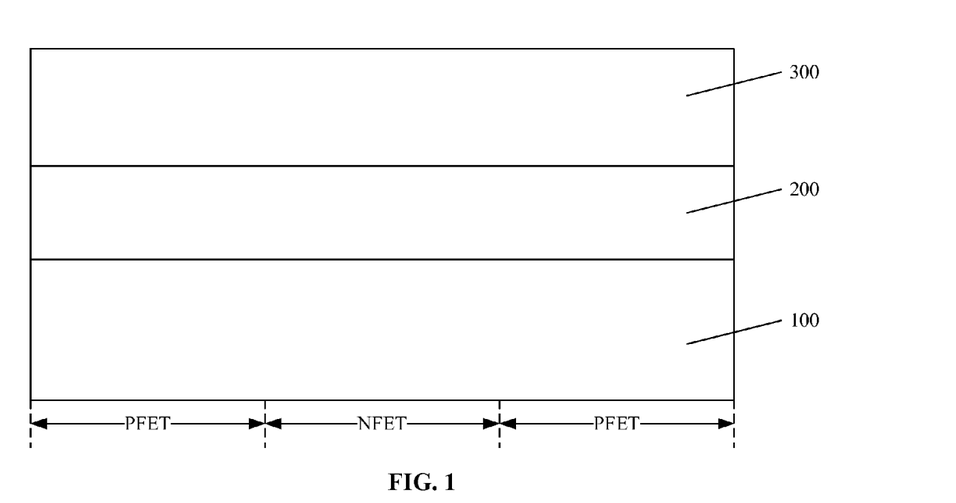
FIGS. 1~11 illustrate semiconductor structures corresponding to certain stages of an exemplary fabrication process of a semiconductor structure consistent with the disclosed embodiments.

As shown in FIG. 12, at the beginning of fabrication process, a semiconductor substrate is provided (S101). FIG. 1 illustrates a corresponding semiconductor structure.

As shown in FIG. 1, a semiconductor substrate 100 is provided. The semiconductor substrate 100 may have a plurality of PFET regions and a plurality of NFET regions. For illustrative purposes, one NFET region and two PFET regions are shown in FIG. 1. Further, an insulation layer 200 may be formed on the surface of the semiconductor substrate 100; and a sacrificial layer 300 may be formed on the surface of the insulation layer 200.

The semiconductor substrate 100 may be made of any appropriate semiconductor materials, such as single crystal silicon, polysilicon, silicon on insulator (SOI), silicon germanium, carborundum, indium antimonite, lead telluride, indium arsenide, indium phosphide, gallium arsenide, gallium antimonite, alloy semiconductor or a combination thereof. In one embodiment, the semiconductor substrate 100 is made of single crystal silicon. The surface of the semiconductor substrate 100 may be a (100) crystal face. In certain other embodiments, the surface of the substrate 100 may be any other appropriate crystal faces. The semiconductor substrate 100 provides a base for subsequent devices and processes.

In certain embodiments, the semiconductor substrate 100 may have a plurality of NFET regions and a plurality of PFET regions. An N-type FinFET may be subsequently formed in each of the NFET regions; and a P-type FinFET may be subsequently formed in each of the PFET regions. The NFET regions and the PFET regions may be adjacent, or may be isolated. In one embodiment, referring to FIG. 1, the PFET regions and the NFET region are adjacent; and two PFET regions are at both sides of the NFET region.

Further, the insulation layer 200 is formed on the surface of the semiconductor substrate 100. The insulation layer 200 may be used to subsequently form insulation structures between adjacent subsequently formed fin structures. The insulation structures may be used to insulate the subsequently formed gate structures and the semiconductor substrate 100.

The insulation layer 200 may be made of any appropriate material, such as silicon oxide, silicon nitride, silicon oxycarbide, or silicon oxynitride, etc. In one embodiment, the insulation layer 200 is made of silicon oxide.

Various processes may be used to form the insulation layer 200, such as a chemical vapor deposition (CVD) process, a physical vapor deposition (PVD) process, an atomic layer deposition (ALD) process, or a flowable CVD (FCVD) process, etc. In one embodiment, the insulation layer 200 is formed by a CVD process.

Further, the sacrificial layer 300 may be formed on the surface of the insulation layer 200. The sacrificial layer 300 may be used to subsequently form fin structures. Various materials may be used as the sacrificial layer 300, such as silicon oxide, silicon nitride, or silicon oxynitride, etc. In one embodiment, the sacrificial layer 300 is made of silicon nitride.

The sacrificial layer 300 may be formed by any appropriate process, such as a CVD process, a PVD process, an ALD process, or an FCVD process, etc. In one embodiment, the sacrificial layer 300 is formed by a CVD process.

The thickness of the insulation layer 200 may be in a range of approximately 10 nm~100 nm. The thickness of the sacrificial layer 300 may be in a range of approximately 10 nm~100 nm.

Figure 2:
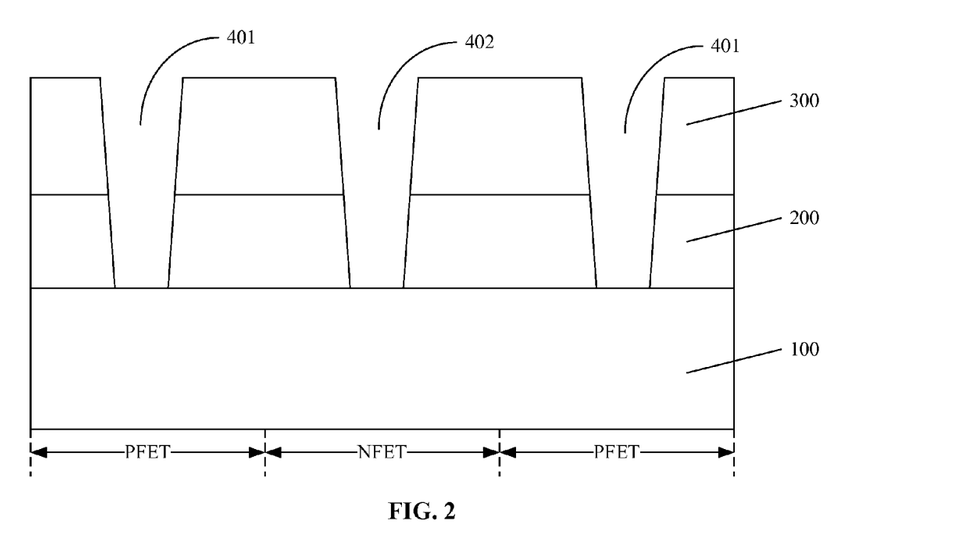

Returning to FIG. 12, after forming the sacrificial layer 300, a plurality of first trenches and a plurality of second trenches may be formed (S102). FIG. 2 illustrates a corresponding semiconductor structure.

As shown in FIG. 2, a first trench 401 is formed in the sacrificial layer 300 and the insulation layer 200 in each of the PFET regions; and a second trench 402 is formed in the sacrificial layer 300 and the insulation layer 200 in each of the NFET regions. For illustrative purposes, two first trenches 401 and one second trench 402 are described. The first trenches 401 and the second trench 402 may be formed by etching the sacrificial layer 300 and the insulation layer 200.

Various etching processes may be used to etch the sacrificial layer 300 and the insulation layer 200, such as a dry etching process, a wet etching process, or an ion beam etching process, etc. In one embodiment, the sacrificial layer 300 and the insulation layer 200 are etched by a dry etching process. Specifically, a photoresist layer may be formed on the sacrificial layer 300. Then, the photoresist layer may be exposed, and developed to form a plurality of openings in the photoresist layer. The plurality of the openings may expose portions of the surface of the sacrificial layer 300. Then, the sacrificial layer 300 and the insulation layer 200 may be etched by the dry etching process using the patterned photoresist layer as an etching mask until the surface of the semiconductor substrate 100 is exposed. Thus, the first trenches 401 and the second trench 402 may be formed.

The etching gas of the dry etching process may include one of $CF_4$, $CHF_3$, and $C_2F_6$, etc. In one embodiment, the etching gas is $CF_4$. The diluting gas may be He, etc. The pressure of the diluted etching gas may be in a range of approximately 20 mTorr~200 mTorr. The flow rate of $CF_4$ may be in a range of approximately 50 sccm~1000 sccm. The flow rate of He may be in a range of approximately 50 sccm~1000 sccm.

Referring to FIG. 2, by adjusting the fabrication parameters of the first trenches 401 and the second trench 402, the first trenches 401 and the second trench 402 may have a tapered shape. That is, the side surfaces of the first trenches 401 and the second trench 402 may not be perpendicular to the surface of the semiconductor substrate 100; and the top width of the first trenches 401 and the second trench 402 may be greater than the bottom width of the first trenches 401 and the second trenches 402. In one embodiment, the acute angle between the side surfaces of the first trenches 401 and the second trenches 402 and the surface of the substrate 100 may be in a range of approximately 80°~89°. In certain other embodiments, the side surfaces of the first trenches 401 and the second trenches 402 may be perpendicular to the surface of the semiconductor substrate 100.

First semiconductor layers and second semiconductor layers may be subsequently formed in the first trenches 401 and the second trench 402 to be used as fins of FinFETs. The tapered shape of the first trenches 401 and the second trench 402 may aid the reaction gas for subsequently forming the first semiconductor layers and the second semiconductor layers to enter into the first trenches 401 and the second trench 402. Thus, it may lower the difficulty of the epitaxial growth of the semiconductor material in the first trenches 401 and the second trenches 402. Further, with such a tapered shape, the top width of the subsequently formed first semiconductor layers and the second semiconductor layers may be greater than the bottom width of the subsequently formed first semiconductor layers and the second semiconductor layers. Thus, the channel width of the FinFETs may be increased; and the performance of the FinFETs may be improved.

Figure 3:
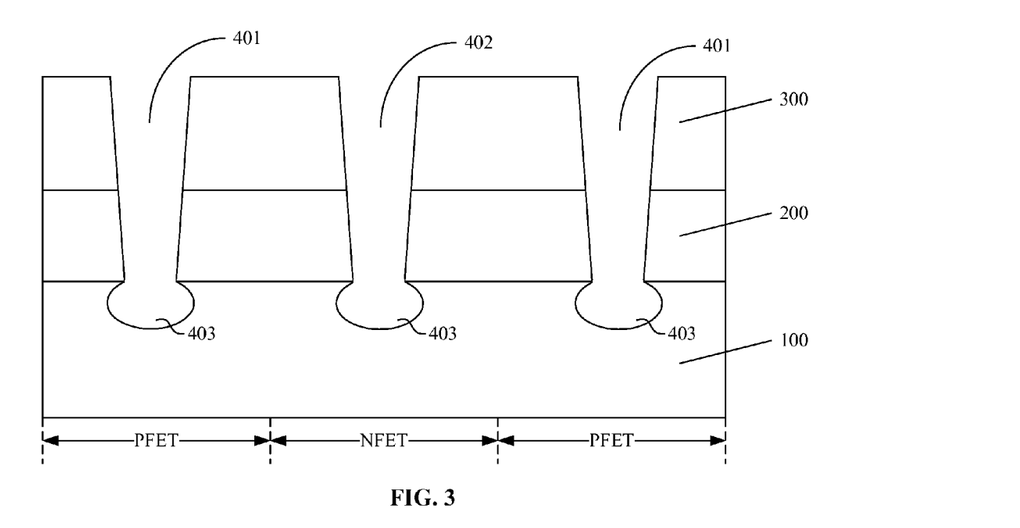

Returning to FIG. 12, after forming the first trenches 401 and the second trenches 402, third trenches may be formed (S103). FIG. 3 illustrates a corresponding semiconductor structure.

As show in FIG. 3, a third trench 403 is formed under the bottom of each of the first trenches 401 and the second trenches 402. The third trenches 403 may be formed by etching the bottoms of the first trenches 401 and the second trenches 402 after forming the first trenches 401 and the second trenches 402. Specifically, the semiconductor substrate 100 may be etched using the sacrificial layer 300 and the insulation layer 200 as an etching mask along the first trenches 401 and the second trenches 402.

The side surfaces of the third trenches 403 may be any appropriate shape, such as a "Σ" shape, or an arc shape, etc. In one embodiment, the third trenches 403 have arc shaped side surfaces. Thus, referring to FIG. 3, the cross-section view of the third trenches 403 is bowl shaped.

The third trenches 403 may be formed by any appropriate process, such as a dry etching process, or a wet etching process, etc. In one embodiment, an isotropic dry etching process is used to etch the semiconductor substrate 100 to form the third trenches 403. The etching gas of the isotropic dry etching process may include HCl, $Cl_2$, or HBr, etc. The etch gas may thermodynamically move along the lateral direction and the vertical direction. Thus, the substrate 100 under the first trenches 401 and the second trenches 402 may be etched to form the third trenches 403. The depth of the third trenches 403 may be determined by the etching time. In one embodiment, the depth of the third trenches 403 may be in a range of approximately 80 nm~120 nm.

In certain other embodiments, the third trenches 403 may have "Σ" shaped sidewalls. A process for forming the third trenches 403 having the "Σ" shaped sidewalls may include sequentially etching the semiconductor substrate 200 using an isotropic dry etching process to form openings with vertical, or slightly tapered sidewalls; and followed by further etching the semiconductor substrate 100 along the openings by a wet etching process. Because the semiconductor substrate 100 may have different etching rates along different crystal directions, the third trenches 403 with the "Σ" shaped sidewalls may be formed. In certain other embodiments, the third trenches 403 may be omitted.

Figure 4:
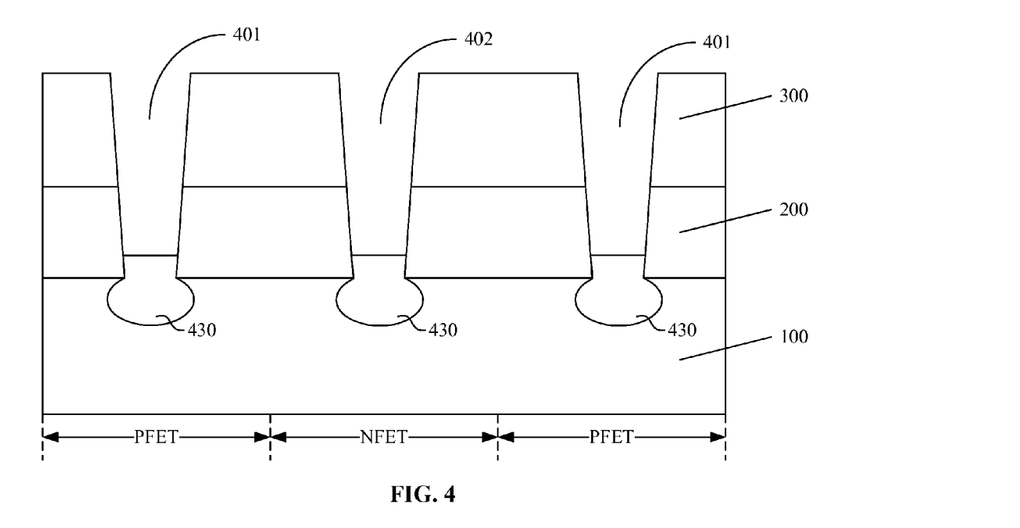

Returning to FIG. 12, after forming the third trenches 403, a plurality of first buffer layers may be formed (S104). FIG. 4 illustrates a corresponding semiconductor structure.

As shown in FIG. 4, a first buffer layer 430 is formed in each of the first trenches 401 and the second trenches 402. In one embodiment, the third trenches 403 may be formed in the semiconductor substrate 100 under the first trenches 401 and the second trenches 402. Thus, the first buffer layer 430 may also be formed in each of the third trenches 403. In certain other embodiments, if the third trenches 403 are omitted, the first buffer layer 430 may only be formed in the first trenches 401 and the second trenches 402.

The crystal lattice constant of the first buffer layers 430 may be in between the crystal lattice constant of the semiconductor substrate 100 and the crystal lattice constant the subsequently formed first semiconductor layers. Because the crystal lattice constant of the first buffer layers 430 may be different from the semiconductor substrate 100, defects, such as dislocations, etc., may be formed on the interface between the first buffer layers 430 and the semiconductor substrate 100 because of the crystal lattice mismatch. However, because the third trenches 403 may have the "Σ" shaped sidewall or the arc shaped sidewalls, the dislocations on the interface between the first buffer layers 430 and the semiconductor substrate 100 may have different directions. The dislocations along different directions may compensate each other. Thus, when increasing the thickness of the first buffer layers 430, the number of the dislocations may be continuously reduced; and there may be no dislocations when the thickness of the first buffer layers 430 reaches a certain value. In one embodiment, referring to FIG. 4, a portion of the first buffer layers 430 may be formed in the first trenches 401 and the second trenches 402. The thickness of the first buffer layers 430 in the first trenches 401 and the second trenches 402 may be in a range of approximately 10 nm~20 nm. Such a thickness may ensure the top surfaces of the first buffer layers 430 not to have defects.

The first buffer layers 430 may be made of any appropriate material, such as silicon, germanium, or silicon germanium, etc. In one embodiment, the first buffer layers 430 are made of silicon germanium.

Various processes may be used to form the first buffer layers 430, such as a CVD process, an FCVD process, or an epitaxial growth process, etc. In one embodiment, the first buffer layers 430 are formed by a selective epitaxial growth process.

In one embodiment, the first buff layers 430 may be doped with P-type ions. The P-type ions may be doped in the first buffer layers 430 during the selective epitaxial growth process. That is, an in situ doping process may be used to dope the P-type ions in the first buffer layers 430. The P-type doped first buffer layers 430 may be configured as P-type wells. The P-type wells and the subsequently formed first semiconductor layers may form PN junctions. Thus, the first semiconductor layers and the semiconductor substrate 100 may have a vertical insulation. The P-type doping ions may include B ions, Ga ion, or In ions, etc.

In certain other embodiments, the Ge concentration in the first buffer layers 430 made of SiGe may be increased with the increase of the thickness of the first buffer layers 430. Thus, the surfaces of the first buffer layers 430 may be Ge layers. The Ge layers on the surface of the first buffer layers 430 may aid the subsequent formation of the first semiconductor layers on the first buffer layers 430.

Figure 5:
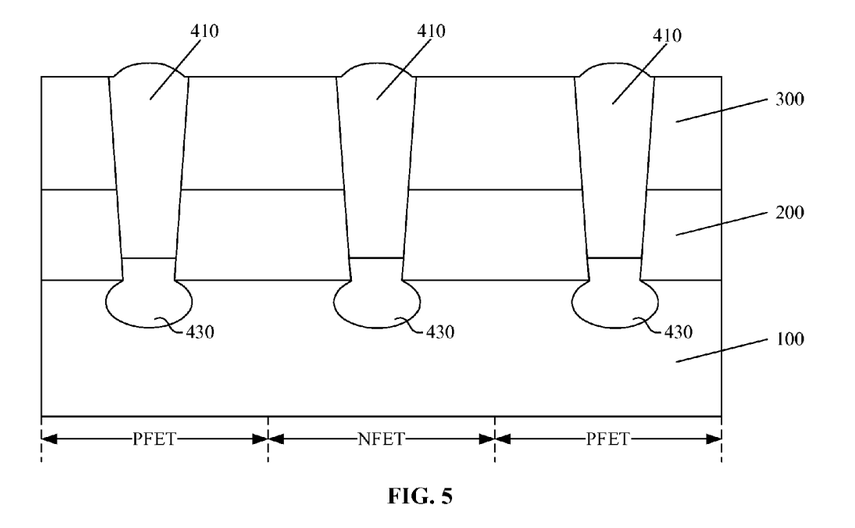

Returning to FIG. 12, after forming the first buffer layers 430, a plurality of first semiconductor layers may be formed (S105). FIG. 5 illustrates a corresponding semiconductor structure.

As shown in FIG. 5, a first semiconductor layer 410 is formed on each of the first buffer layers 430. Further, the first semiconductor layer 410 may fill each of the first trenches 401 and the second trenches 402.

The first semiconductor layers 410 may be made of any appropriate material, such as Si, Ge, or SiGe, etc. In one embodiment, the first semiconductor layers 410 are made of Ge.

Various processes may be used to form the first semiconductor layers 410, such as a CVD process, a PVD process, an FCVD process, or an epitaxial growth process, etc. In one embodiment, the first semiconductor layers 410 are formed by a selective epitaxial growth process.

Referring to FIGS. 4~5, the first buffer layers 430 may be formed in the third trenches 403, the second trenches 402, and the first trenches 401 before forming the first semiconductor layers 410. The first buffer layers 430 may be made of SiGe; and the first semiconductor layers 410 may be made of Ge. Thus, the difference between the crystal lattice constant of the first buffer layers 430 and the crystal lattice constant of the first semiconductor layers 410 may be substantially small. Further, the difference between the crystal lattice constant of the first buffer layers 430 and the crystal lattice constant of the semiconductor substrate 100 may also be substantially small. Therefore, the quality of the first semiconductor layers 410 may be improved; and the defects formed in the first semiconductor layers 410 may be reduced.

Further, referring to FIG. 5, the first semiconductor layers 410 may fill the first trenches 401 and the second trenches 402. The gas exchange in the middle of the first trenches 401 and the second trenches 402 may be faster than the gas exchange near the side surfaces of the first trenches 401 and the second trenches 402 during the process for forming the first semiconductor layers 410. Thus, the growth rate of the first semiconductor layers 410 in the middle of the first trenches 401 and the second trenches 402 may be greater than the growth rate of the first semiconductor layers 410 near the side surfaces of the first trenches 401 and the second trenches 402. Therefore, the top of the first semiconductor layers 410 may be arc shaped. That is, the top of the first semiconductor layers 410 may be slightly higher than the surface of the sacrificial layer 300.

In one embodiment, the first semiconductor layers 410 may be used as the fins of subsequently formed P-type FinFETs. Thus, N-type ions may be doped into the first semiconductor layers 410. The N-type ions may be doped into the first semiconductor layers 410 during the selective epitaxial growth process by an in situ doping process. The N-type ions may include P ions. As ions, or Sb ions, etc.

The first semiconductor layers 410 may be made of Ge. Ge may have a relatively high hole carrier mobility. When the first semiconductor layers 410 made of Ge are used as the fin structures of the subsequently formed P-type FinFETs, the carrier mobility of the P-type FinFETs may be increased. Thus the performance of the P-type FinFETs may be improved.

Further, the first buffer layers 430 may be formed in third trenches 403, the second trenches 402, and the first trenches 401 before forming the first semiconductor layers 410. The crystal lattice constant of the surface of the first buffer layers 430 may be similar, or identical to the crystal lattice constant of the first semiconductor layers 410. Thus, the quality of the first semiconductor layers 410 may be improved; and the defects in the first semiconductor layers 410 may be reduced. Therefore, the performance of the subsequently formed P-type FinFETs may be improved.

Figure 6:
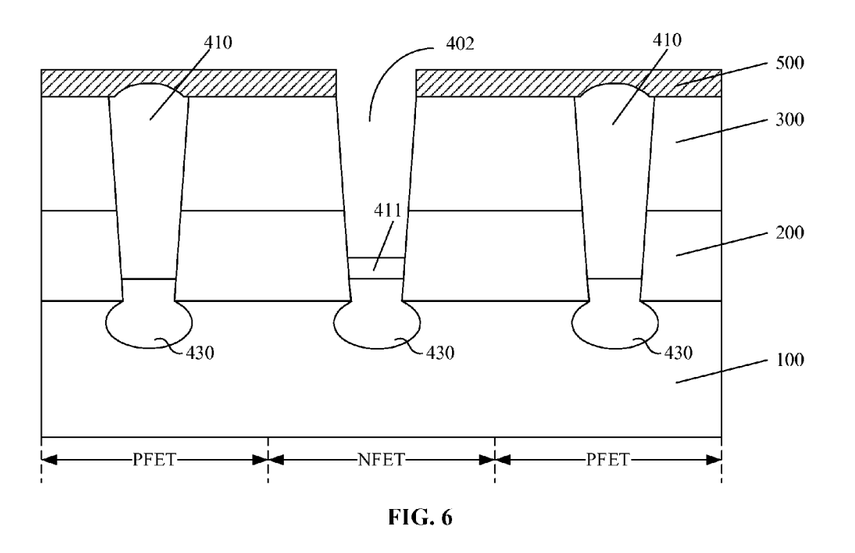

Returning to FIG. 12, after forming the first semiconductor layers 410, the first semiconductor layers 410 in the second trenches 402 may be removed (S106). FIG. 6 illustrates a corresponding semiconductor structure.

As shown in FIG. 6, a portion of the first semiconductor layer 410 in the second trench 402 is removed. The remaining portion of the first semiconductor layer 410 in the second trench 402 may be referred as a remaining first semiconductor layer 411. The surface of the remaining first semiconductor layer 411 may be lower than the surface of the insulation layer 200. The remaining first semiconductor layer 411 may be used as a transitional layer for subsequently forming a second buffer layer and a second semiconductor layer. In certain other embodiments, the first semiconductor layers 410 in the second trenches 402 may by entirely removed. Thus, the second buffer layers may be subsequently formed on the first buffer layers 430.

A process for removing the first semiconductor layers 410 in the second trenches 402 may include forming a hard mask layer 500 on the sacrificial layer 300. The hard mask layer 500 may cover the first semiconductor layers 410 in the PFET regions; and expose the first semiconductor layers 410 in the NFET regions. Further, the process may include etching the first semiconductor layers 410 in the second trenches 402 using the hard mask layer 500 as an etching mask.

The hard mask layer 500 may be made of any appropriate material, such as silicon oxide, silicon nitride, or silicon oxynitride, etc. Various processes may be used to form the hard mask layer 500, such as a CVD process, a PVD process, or an FCVD process, etc. The first semiconductor layers 410 may be etched by any appropriate process, such as a dry etching process, or a wet etching process, etc.

Figure 7:
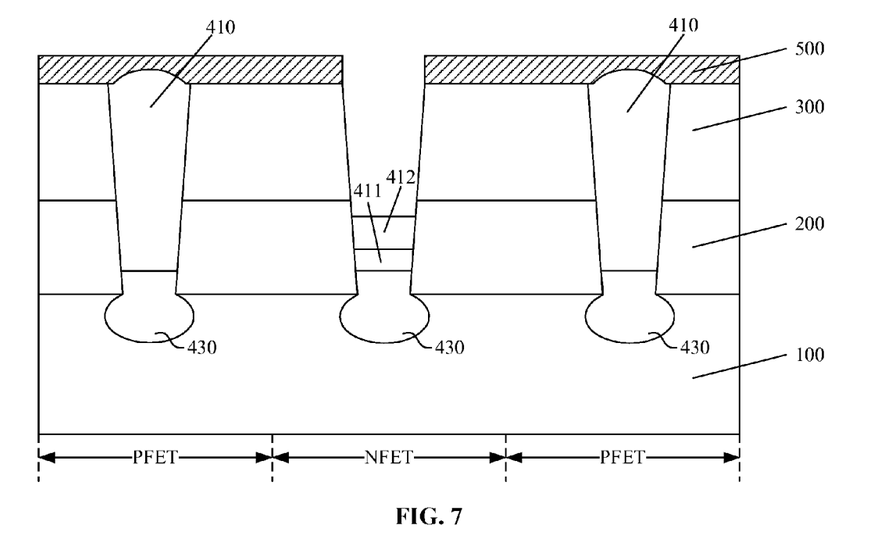

Returning to FIG. 12, after removing the first semiconductor layers 410 in the second trenches 402, a plurality of second buffer layers may be formed (S107). FIG. 7 illustrates a corresponding semiconductor structure.

As shown in FIG. 7, a second buffer layer 412 is formed on each of the remaining first semiconductor layers 411. The second buffer layers 412 may be used to compensate the crystal lattice mismatch between the remaining first semiconductor layers 411 and the subsequently formed second semiconductor layers. The surface of the second buffer layers 412 may be lower than the surface of the insulation layer 200. The crystal lattice constant of the second buffer layers 412 may be greater than the crystal lattice constant of the remaining first semiconductor layers 411; and may be smaller than the crystal lattice constant of the subsequently formed second semiconductor layers.

In certain other embodiments, the first semiconductor layers 410 may be entirely removed. Thus, the second buffer layers 412 may be formed on the surfaces of the first buffer layers 430. The second buffer layers 412 may be used to compensate the crystal lattice mismatch between the first buffer layers 430 and the subsequently formed second semiconductor layers. The crystal lattice constant of the second buffer layers 412 may be greater than the crystal lattice constant of the first buffer layers 430; and may be smaller than the crystal lattice constant of the subsequently formed second semiconductor layers.

The second buffer layers 412 may be made of any appropriate material, such as InP, or InAlAs, etc. Various processes may be used to form the second buffer layers 412, such as a metal-organic CVD (MOCVD) process, or a molecular beam epitaxial growth (MBE) process, a CVD process, or an FCVD process, etc.

Referring to FIG. 7, the thickness of the second buffer layers 412 may be in a range of approximately 5 nm~30 nm. Further, the surfaces of the second buffer layers 412 may be lower than the surface of the insulation layer 200. Such a thickness and configuration may ensure the second buffer layers 412 not to be exposed after subsequently removing the sacrificial layer 300.

The crystal lattice constant of the second buffer layers 412 may be different from the remaining first semiconductor layers 411. Thus, defects, such as dislocations, etc., may be formed in the second buffer layers 412. When increasing the thickness of the second buffer layers 412 during the process for forming the second buffer layers 412, the numbers of the defects in the second buffer layers 412 may be gradually reduced. When the thickness of the second buffer layers 412 reaches a certain value, the surfaces of the second buffer layers 412 may have no defects. Thus, when second semiconductor layers are subsequently formed on the surfaces of the second buffer layers 412, the defects in the second semiconductor layers may be reduced; and the quality of the second semiconductor layers may be improved. If the second buffer layers 412 are omitted, the difference between the crystal lattice constant of the remaining first second conductor layers 411 and the crystal lattice constant of the second semiconductor layers may be relatively large. Thus, a large quantity of defects may be formed in the subsequently formed second semiconductor layers; and the performance of the subsequently formed FinFETs may affected.

In one embodiment, the second buffer layers 412 may be doped with N-type ions. The N-type ions may be doped in the second buffer layers 412 by an in situ doping process during the process for forming the second buffer layers 412. The N-type doped second buffer layers 412 may be configured as N-type wells. The N-type wells and the subsequently formed second semiconductor layers may form PN junctions; and may vertically insulate the subsequently formed second semiconductor layers from the semiconductor substrate 100. The N-type ions may include P ions, As ions, or Sb ions, etc.

Figure 8:
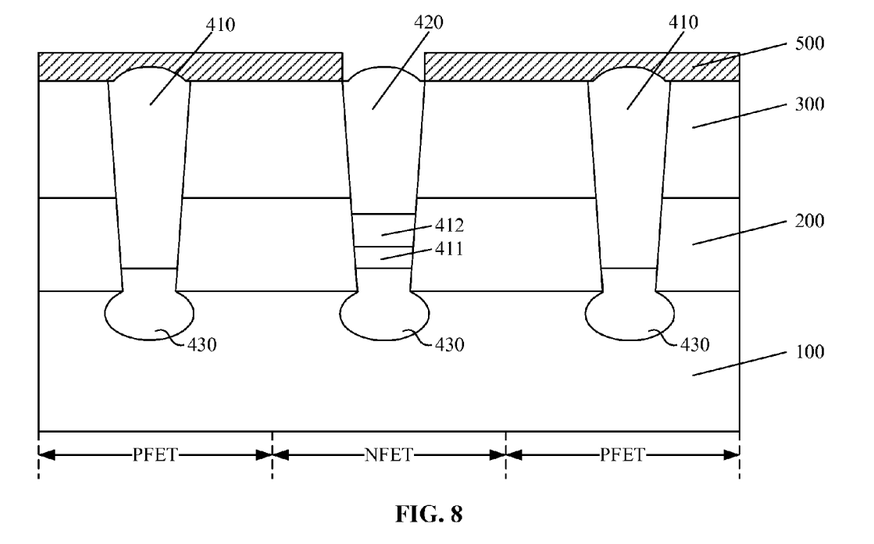

Returning to FIG. 12, after forming the second buffer layers 412, a plurality of second semiconductor layers may be formed (S108). FIG. 8 illustrates a corresponding semiconductor structure.

As shown in FIG. 8, a second semiconductor layer 420 is formed on each of the second buffer layers 412. The second semiconductor layers 420 may be made of any appropriate material, such as InAs, InSb, GaSb, or InGaAs, etc. Such materials may have relatively high carrier mobility. The second semiconductor layers 420 may be used as the fin structures of the N-type FinFETs subsequently formed in the NFET regions. Thus, the carrier mobility of the N-type FinFETs may be increased; and the performance of the N-type FinFETs may be improved.

The second semiconductor layers 420 may be formed by any appropriate epitaxial growth process, such as a MOCVD process, a MBE process, a CVD process, or an FCVD process, etc. The growth rate of the epitaxial growth process may be relatively low. Thus, by controlling the growth time, the height of the second semiconductor layers 420 may be precisely controlled. In one embodiment, the top of the second semiconductor layers 420 may be arch shaped; and the surfaces of the second semiconductor layers 420 may level with the surfaces of the first semiconductor layers 410. In certain other embodiments, the height of the second semiconductor layers 420 may determine the channel width of the subsequently formed N-type FinFETs.

In certain other embodiments, the semiconductor substrate 100 may have a plurality of PFET regions and a plurality of NFET regions. The first semiconductor layers 410 and the second semiconductor layers 420 may all be formed by epitaxial growth processes. Thus, the heights of the first semiconductor layers 410 in the different PFET regions may be identical. The heights of the second semiconductor layers 420 in different NFET regions may be identical. Therefore, the P-type FinFETs formed in different PFET regions may have an identical channel width; and the N-type FinFETs formed in different NFET regions may have an identical channel width.

Defects may be formed in the interface layers between the second semiconductor layers 420 and the second buffer layers 412 because of the crystal lattice mismatch. However, the crystal lattice mismatch may be relatively small. With the increase of the thickness of the second semiconductor layers 420, the defects may be gradually reduced; and may disappear when the thickness of the second semiconductor layers 420 reaches a certain value. Further, the surfaces of the second buffer layers 412 may be lower than the surface of the insulation layer 200; and portions of the second semiconductor layers 420 may be below the sacrificial layer 300. Thus, the height of the portions of the second semiconductor layers 420 below the sacrificial layer 300 may cause the portions of the second semiconductor layers 420 higher than the sacrificial layer 300 not to have defects. Therefore, the performance of the FinFETs having such second semiconductor layers 420 as fin structures may be improved.

In one embodiment, the second semiconductor layers 420 may be doped with P-type ions. The P-type ions may be in situ doped during the process for forming the second semiconductor layers 420. The P-type ions may include B ions, Ge ions, or In ions, etc.

Figure 9:
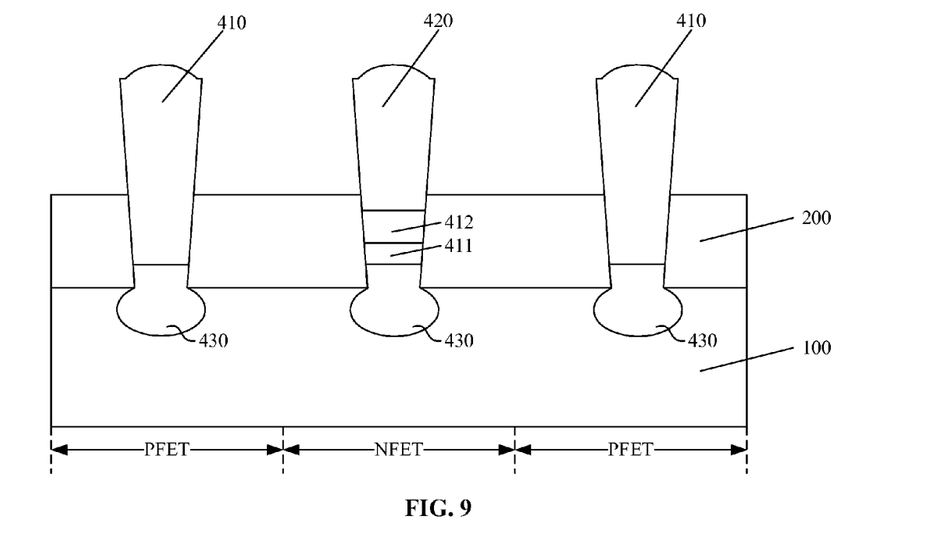

Returning to FIG. 12, after forming the second semiconductor layers 420, the sacrificial layer 300 may be removed (S109). FIG. 9 illustrates a corresponding semiconductor structure.

As shown in FIG. 9, the hard mask layer 500 is removed; and the sacrificial layer 300 is also removed after removing the hard mask layer 500. Thus, portions of the side surfaces of the first semiconductor layers 410, and portions of the side surfaces of the second semiconductor layers 420 are exposed.

The sacrificial layer 300 and the hard mask layer 500 may be removed by any appropriate process. In one embodiment, the hard mask layer 500 may be made of silicon oxide; and the sacrificial layer 300 may be made of silicon nitride. Thus, a hydrogen fluoride solution may be used to remove the hard mask layer 500 first; and then a phosphoric acid solution may be used to remove the sacrificial layer 300.

In certain other embodiments, a planarization process may be performed after removing the hard mask layer 500. The sacrificial layer 300 may be used as a stop layer of the planarization process. After the planarization process, the top surfaces of the first semiconductor layers 410 and the top surfaces of the second semiconductor layers 420 may level with the top surface of the sacrificial layer 300.

The planarization process may include any appropriate process, such as a chemical mechanical polishing, process, or a physical mechanical polishing process, etc. In one embodiment, a chemical mechanical polishing process is used to planarize the first semiconductor layers 410 and the second semiconductor layers 420.

Referring to FIG. 9, after removing the sacrificial layer 300, the portions of the side surfaces of the first semiconductor layers 410 higher than the surface of the insulation layer 200 may be exposed. Further, the portions of the side surfaces of the second semiconductor layers 420 higher than the surface of the insulation layer 200 may also be exposed. The isolation layer 200 may be configured as an insulation structure between adjacent first semiconductor layers 410 and second semiconductor layers 420. The isolation layer 200 may also be used as insolation structures between the subsequently formed first gate structures and the semiconductor substrate 100. Further, the isolation layer 200 may also be used as an isolation structure between the subsequently formed second gate structures and the semiconductor substrate 100.

Further, referring to FIGS. 8~9, the portions of the first semiconductor layers 410 and the portions of the second semiconductor layers 420 may be subsequently configured as the fin structures of FinFETs. Thus, the thickness of the sacrificial layer 300 may determine the height of the fins of the FinFETs. Further, by controlling the thickness of the sacrificial layer 300, the top width of the first trenches 401, and the top width of the second trenches 402, the channel width of the subsequently formed FinFETs may be adjusted.

Returning to FIG. 12, after removing the sacrificial layer 300, a rounding process may be performed on the first semiconductor layers 410, and the second semiconductor layers 420 (S110). FIG. 10 illustrates a corresponding semiconductor structure.

As shown in FIG. 10, the first semiconductor layers 410 and the second semiconductor layers 420 are rounded. That is, the top surfaces of the first semiconductor layers 410 and the second semiconductor layer 420 and the side surfaces of the first semiconductor layers 410 and the second semiconductor layer 420 may have arc transitions. Such arc transitions may avoid a leakage current issue caused by sharp transitions (sharp corners illustrates in FIG. 9).

The rounding process may be any appropriate process. In one embodiment, the rounding process may include a thermal annealing process and an etching process.

The thermal annealing process may be performed in a protective gas environment. In one embodiment, the protective gas is $H_2$. The temperature of the thermal annealing process may be in range of approximately 800° C.~1500° C.

The etching process may be any appropriate etching process, such as a dry etching process, or a wet etching process, etc. In one embodiment, the etching process is a remote plasma-assisted dry etching process. The etching gas of the remote plasma-assisted dry etching process may include $NF_3$ and $NH_3$, etc. The ratio of $NF_3$ and $NH_3$ may be in a range of approximately 1:20~5:1. The etching temperature may be in a range of approximately 40° C.~80° C. The pressure of the remote plasma-assisted dry etching process may be in a range of approximately 0.5 Torr~50 Torr. The power of the remote plasma may be lower than approximately 100 W. The frequency of the remote plasma may be lower than approximately 100 KHz. Thus, the energy of the remote plasma-assisted dry etching process may be relatively low; and it might not generate defects on the surfaces of the first semiconductor layers 410 and the second semiconductor layers 420.

The rounding process may cause the side surfaces and the top surfaces of the first semiconductor layers 410 and the second semiconductor layers 420 to have arc transitions. Thus, the electric field may not be accumulated when the FinFETs are in function; and the leakage current may be avoided. In certain other embodiments, the rounding process may be omitted.

Returning to FIG. 12, after performing the rounding process, a plurality of first gate structures and a plurality of second gate structures may be formed (S111). FIG. 11 illustrates a corresponding semiconductor structure.

As shown in FIG. 11, a first gate structure 510 overlying on each of the first semiconductor layers 410 is formed on the insulation layer 200; and a second gate structure 520 overlying on each of the second semiconductor layers 420 is formed on the insulation layer 200. Each of the first gate structures 510 may include a first gate dielectric layer 501 formed on portions of the side surfaces of the first semiconductor layer 410 and portions of the surface of the insulation layer 200. The first gate structure 510 may also include a first gate electrode 502 formed on the surface of the first gate dielectric layer 501. Each of the second gate structure 520 may include a second gate dielectric layer 503 formed on portions of the side surfaces of the second semiconductor layer 420; and portions of the surface of the insulation layer 200. The second gate structure 520 may also include a second gate electrode 504 formed on the surface of the second gate dielectric layer 503.

The first gate dielectric layers 501 and the second gate dielectric layers 503 may be made of any appropriate material, such as a high dielectric constant (high-K) material, or silicon oxide, etc. The high-K material may include HfO, ZrO, AlO, HfSiO, or ZrSiO, etc. The first gate electrodes 502 and the second gate electrodes 504 may be made of a metal material, such as Ti, TiN, Ag, Al, or Cu, etc.

A process for forming the first gate structures 510 and the second gate structures 520 may include sequentially forming a gate dielectric film on the first semiconductor layers 410, the second semiconductor layers 420, and the surface of the insulation layer 200; forming a gate electrode film on the gate dielectric film; forming a patterned mask layer on the gate electrode film; and etching the gate electrode film and the gate dielectric film using the patterned mask layer as an etching mask until the surface of the insulation layer 200 is exposed. Thus, the first gate structures 510 and the second gate structures 520 may be formed.

The gate dielectric film and the gate electrode film may be formed by any appropriate process, such as a CVD process, a PVD process, or an FCVD process, etc. Various processes may be used to etch the gate dielectric film and the gate electrode film, such as a dry etching process, a wet etching process, or an ion beam etching process, etc.

Thus, a semiconductor structure may be formed by the above disclosed processes and methods; and the corresponding semiconductor structure is illustrated in FIG. 11. As shown in FIG. 11, the semiconductor structure includes a semiconductor substrate 100 having a plurality of PFET regions and a plurality of NFET regions; and an insulation layer 200 formed on the surface of the semiconductor substrate 100. The semiconductor structure also includes a first buffer layer 430 formed in the semiconductor substrate 100 in each of the PFET regions and the NFET regions; and a first semiconductor layer 410 having a tapered shape formed on each of the first buffer layers 430 with one portion in the insulation layer 200, and the other portion above the insulation layer 200 in the PFET regions.

Further, the semiconductor structure also includes a remaining first semiconductor layer 411 formed on each of the first buffer layers 430 in the NFET regions; a second buffer layer 412 formed on each of the remaining first semiconductor layers 411 in the insulation layer 200; and a second semiconductor layer 420 with a tapered shape formed on each of the second buffer layers 412 with one portion in the insulation layer 200 and the other portion above the insulation layer 200.

Further, the semiconductor structure also includes a first gate structure 510 formed on the insulation layer 200 and overlying on each of the first semiconductor layers 410 in the PFET regions; and a second gate structure 520 formed on the insulation layer 200 and overlying on each of the second semiconductor layers 420 in the NFET regions. The detailed structures and intermediate structures are described above with respect to the fabrication processes.

According to the disclosed methods and structures, a plurality of first buffer layers may be formed to reduce the crystal lattice mismatch between the first semiconductor layers and the semiconductor substrate. Thus, the defects in the first semiconductor layers may be reduced. When the first semiconductor layers are subsequently configured as fin structures of FinFETs, the performance of the FinFETs may be improved.

Further, after removing the first semiconductor layers in the NFET regions and before forming the second semiconductor layers, a plurality of second buffer layers may be formed. The second buffer layers may be used to further reduce the crystal lattice mismatch between the second semiconductor layers and the material under the second semiconductor layers. Thus, the defects in the second semiconductor layers may be further reduced. When the second semiconductor layers are subsequently configured as the fin structures of FinFETs, the performance of the FinFETs may be improved.

Further, the first semiconductor layers and the second semiconductor layers may be formed by epitaxial growth processes. Thus, it may ensure that the heights of the first semiconductor layers in different regions may be identical; and the heights of the second semiconductor layers in different regions may be identical. Therefore, the channel widths of the P-type FinFETs in different regions may be identical; and the channel widths of the N-type FinFETs in different regions may be identical.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor structure, comprising:
   providing a semiconductor substrate having a plurality of NFET regions and a plurality of PFET regions;
   forming an insulation layer on a surface of the semiconductor substrate;
   forming a sacrificial layer on the insulation layer;
   forming a first trench in each of the PFET regions, and a second trench in each of the NFET regions;
   forming a third trench on bottom of each of the first trenches and the second trenches;
   forming a first buffer layer in each of the first trenches and the second trenches by filling the third trenches;
   forming a first semiconductor layer on each of the first buffer layers;
   removing the first semiconductor layers in the second trenches in the NFET regions;
   forming a second buffer layer with a top surface in each of the second trenches, wherein the top surface of the second buffer layer is lower than a plane defined by an intersection of the insulation layer and the sacrificial layer;
   forming a second semiconductor layer on each of the second buffer layers; and
   removing the sacrificial layer, thereby exposing portions of side surfaces of the first and second semiconductor layers; and forming first and second gate structures on the first and second semiconductor layers respectively.

2. The method according to claim 1, wherein:
   the third trenches have arc shaped side surfaces, or "Σ" shaped side surfaces.

3. The method according to claim 1, wherein:
   the first trenches and the second trenches have tapered shape;
   a top size of the first trenches and the second trenches is greater than a bottom size of the first trenches and the second trenches; and
   an acute angle between the side surfaces of the first trenches and the second trenches and the surface of the semiconductor substrate is in a range of approximately 85°~89°.

4. The method according to claim 1, wherein:
   portions of the first semiconductor layers in the NFET regions are removed;
   surfaces of portions of the first semiconductor layers remaining in the second trenches are lower than a surface of the insulation layer; and
   the second buffer layers are formed on the remaining portions of the first semiconductor layers.

5. The method according to claim 4, wherein:
   a crystal lattice constant of the second buffer layers is greater than a crystal lattice constant of the first semiconductor layers, and smaller than a crystal lattice constant of the second semiconductor layers.

6. The method according to claim 5, wherein:
   the second semiconductor layers are made of one or more of InAs, InSb, GaSb, and InGaAs;
   the second buffer layers are made of one or more of InP and InAlAs;
   the first buffer layers are made of SiGe; and
   the first semiconductor layers are made of Ge.

7. The method according to claim 1, after removing the sacrificial layer, further including:
   performing a rounding process on the first semiconductor layers and the second semiconductor layers.

8. The method according to claim 7, wherein:
   the rounding process includes a remote plasma-assisted dry etching process;
   the etching gas includes $NF_3$ and $NH_3$;
   a flow rate ratio of $NF_3$ and $NH_3$ is in a range of approximately 1:20~5:1;
   an etching temperature is in a range of approximately 40° C.~80° C.;
   a pressure of the remote plasma-assisted dry etching process is in a range of approximately 0.5 Torr~50 Torr;
   a power of the remote plasma-assisted dry etching process is lower than approximately 100 W; and
   a frequency of the remote plasma-assisted dry etching process is lower than approximately 100 KHz.

9. The method according to claim 8, wherein:
   the rounding process includes a thermal annealing process;
   a protective gas of the thermal annealing process is $H_2$; and
   a temperature of the thermal annealing process is in a range of approximately 800° C.~1500° C.

10. The method according to claim 1, wherein:
    the first buffers are formed by a selective epitaxial growth process;
    the first semiconductor layers are formed by a selective epitaxial growth process;
    the second buffer layers are formed by a selective epitaxial growth process; and
    the second semiconductor layers are formed by a selective epitaxial growth process.

11. The method according to claim 10, wherein:
    the first buffers are in situ doped with P type ions;
    the first semiconductor layers are in situ doped with N-type ions;
    the second buffer layers are in situ doped with N-type ions; and
    the second semiconductor layers are in situ doped with P-type ions.

* * * * *